(12) United States Patent
Chao et al.

(10) Patent No.: US 9,030,831 B2
(45) Date of Patent: May 12, 2015

(54) LOCKING MECHANISM AND ELECTRONIC DEVICE USING SAME

(75) Inventors: Cheng-Yi Chao, New Taipei (TW); Chih-Chieh Huang, New Taipei (TW); Zuo-Dong Li, Shenzhen (CN); Shi-Yong Huang, Shenzhen (CN); Chung-Yuan Chen, New Taipei (TW); Xiao-Hui Qin, Shenzhen (CN); Huan Ren, Shenzhen (CN); Xue-Deng Pan, Shenzhen (CN); Zhen-Cun Lu, Shenzhen (CN); Yong-Hua Wang, Shenzhen (CN); Zheng-Wei Liu, Shenzhen (CN); Jian-Feng Fan, Shenzhen (CN)

(73) Assignees: Fu Tai Hua Industry (Shenzhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 275 days.

(21) Appl. No.: 13/487,452

(22) Filed: Jun. 4, 2012

(65) Prior Publication Data

US 2013/0135827 A1 May 30, 2013

(30) Foreign Application Priority Data

Nov. 29, 2011 (CN) .......................... 2011 1 0386628

(51) Int. Cl.
*H05K 7/00* (2006.01)
*H04M 1/02* (2006.01)
*H05K 5/00* (2006.01)
*H05K 5/02* (2006.01)
*G06F 1/16* (2006.01)
*H04M 1/03* (2006.01)

(52) U.S. Cl.
CPC ............. *H04M 1/026* (2013.01); *H05K 5/0013* (2013.01); *H05K 5/0208* (2013.01); *G06F 1/1679* (2013.01); *G06F 1/1681* (2013.01); *H04M 1/03* (2013.01)

(58) Field of Classification Search
USPC ......... 361/755, 730, 752, 801–803, 759, 747; 439/513, 189
See application file for complete search history.

(56) References Cited

U.S. PATENT DOCUMENTS

| | | | | |
|---|---|---|---|---|
| 4,964,661 | A | * | 10/1990 | Cadwell et al. ................. 292/87 |
| 5,348,356 | A | * | 9/1994 | Moulton ......................... 292/80 |
| 6,659,516 | B2 | * | 12/2003 | Wang et al. ................ 292/251.5 |
| 7,050,295 | B2 | * | 5/2006 | Kang ........................ 361/679.58 |
| 7,495,901 | B2 | * | 2/2009 | Yun et al. ................. 361/679.55 |
| 7,540,575 | B2 | * | 6/2009 | Mau ........................... 312/223.2 |
| 7,969,731 | B2 | * | 6/2011 | Yang et al. ............... 361/679.55 |
| 8,027,157 | B2 | * | 9/2011 | Shen et al. ................ 361/679.58 |

* cited by examiner

*Primary Examiner* — Hung S Bui
(74) *Attorney, Agent, or Firm* — Novak Druce Connolly Bove + Quigg LLP

(57) ABSTRACT

A locking mechanism includes a first locking member positioned on the first object and a second locking member positioned on the second object. The second locking member can be moved to engage with or disengage from the first locking member. The second object defines at least one through hole for allowing insertion of the disassembly tool to push the second locking member, which disengages the second locking member from the first locking member.

20 Claims, 9 Drawing Sheets

LOCKING MECHANISM AND ELECTRONIC DEVICE USING SAME

BACKGROUND

1. Technical Field

The present disclosure relates to electronic devices, and particularly to an electronic device with a locking mechanism.

2. Description of Related Art

In order to satisfy the needs of users, many companies produce electronic devices (such as mobile phones, computers, and music players) with many different activities, such as playing games, listening to music, and browsing internet. Many of these electronic devices include an upper housing engaged with the lower housing by fixing members, such as screws. However, the fixing members are exposed, and the electronic devices may be disassembled by a user thus invalidating the warranty. However, it may be difficult for a technician to detect such unauthorized disassembly.

Therefore, there is room for improvement in the art.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

A first embodiment of the present disclosure will be described below with reference to the related drawings.

Figure 1:
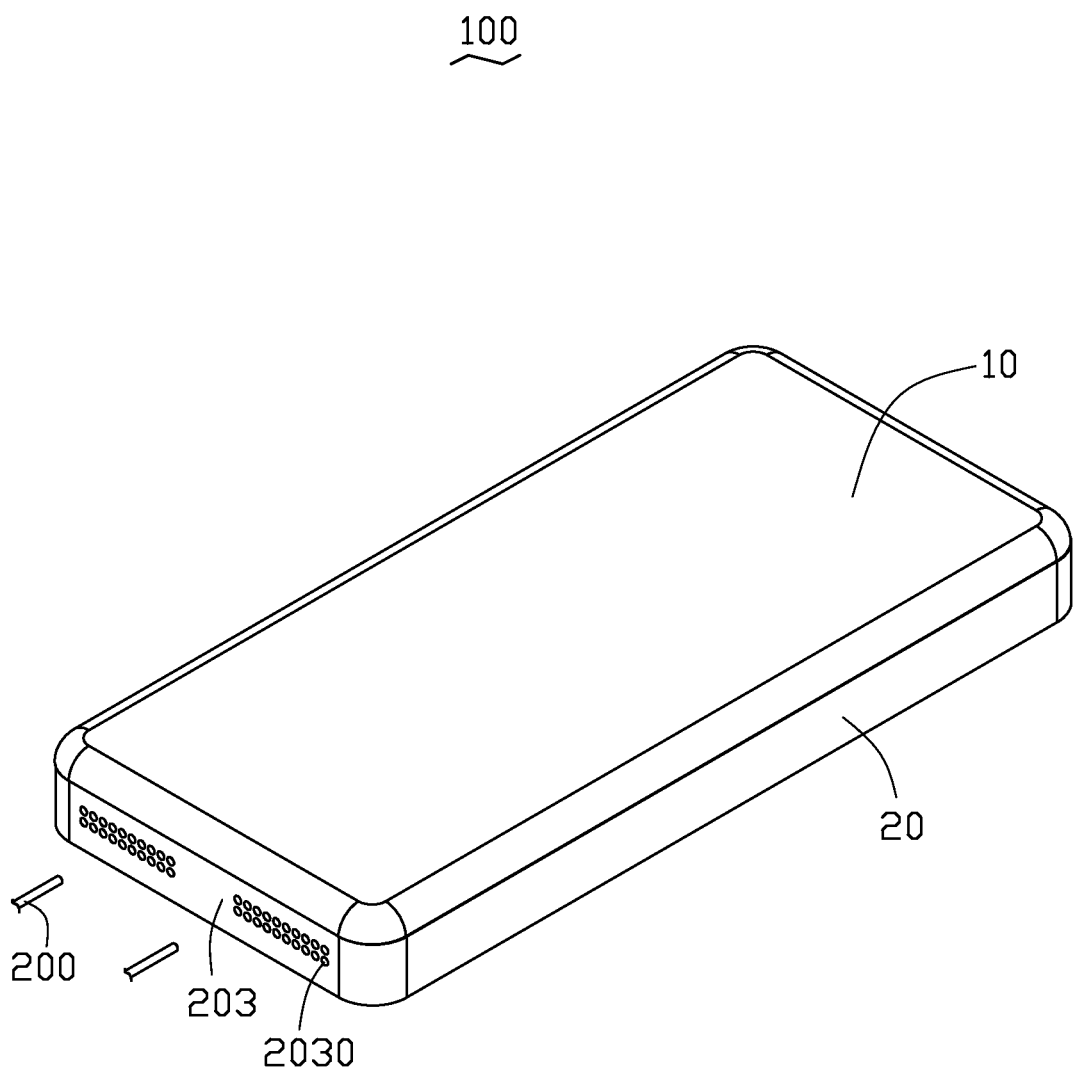
FIG. 1 is an isometric view of an electronic device in a first embodiment with a locking mechanism.
Figure 2:
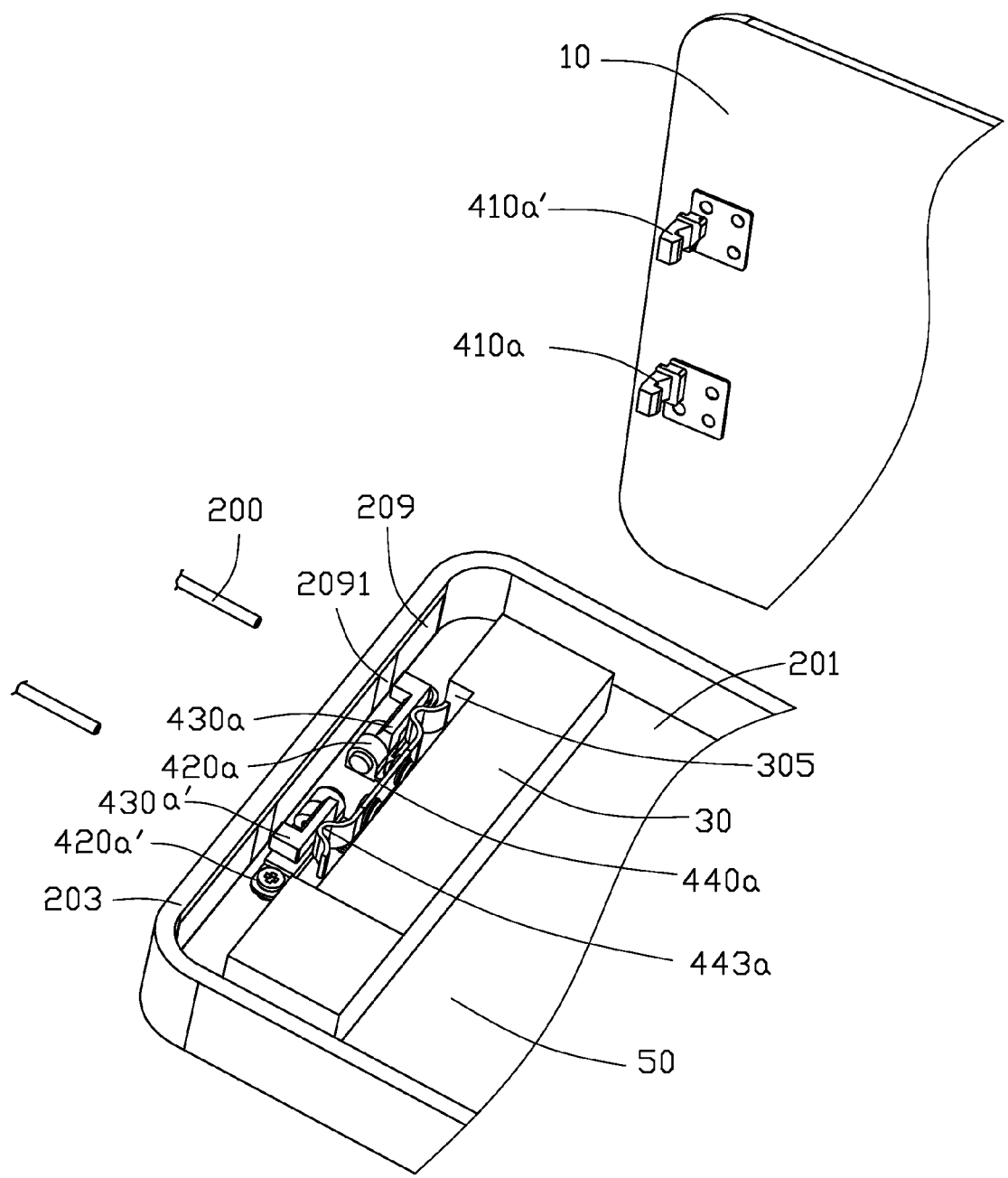
FIG. 2 is a partial, exploded view of the electronic device of FIG. 1.
Figure 4:
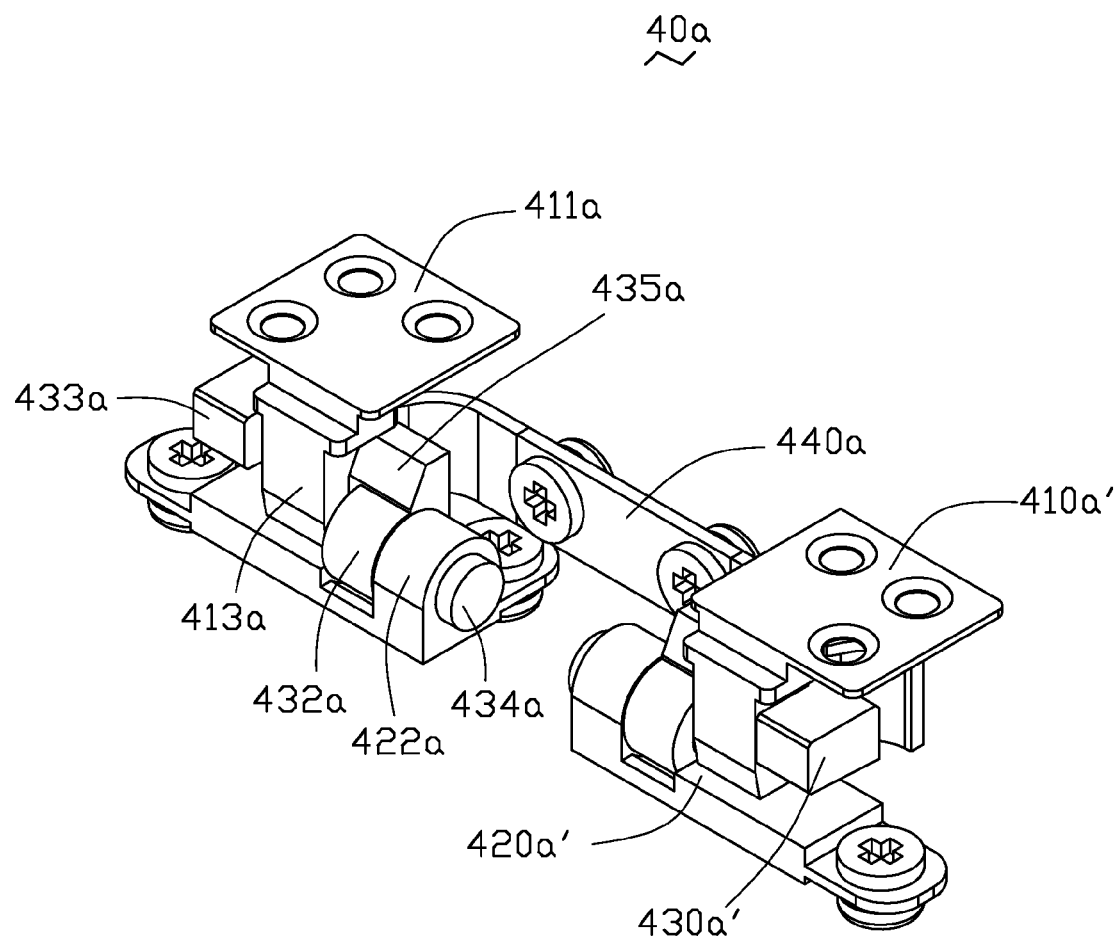
FIG. 4 is a perspective view of the locking mechanism of FIG. 1.

As shown in FIG. 1 and FIG. 2, an electronic device 100 includes an upper cover 10, a lower cover 20, an acoustic module 30, and a locking mechanism 40a (shown in FIG. 4). The upper cover 10 and the lower cover 20 cooperatively define a receiving space 50 for receiving the locking mechanism 40a and the acoustic module 30. The locking mechanism 40a is used for locking the upper cover 10 to the lower cover 20. The electronic device 100 may be, for example, a mobile phone, a computer, or a music player. In the embodiment, the electronic device 100 is a mobile phone.

Figure 3:
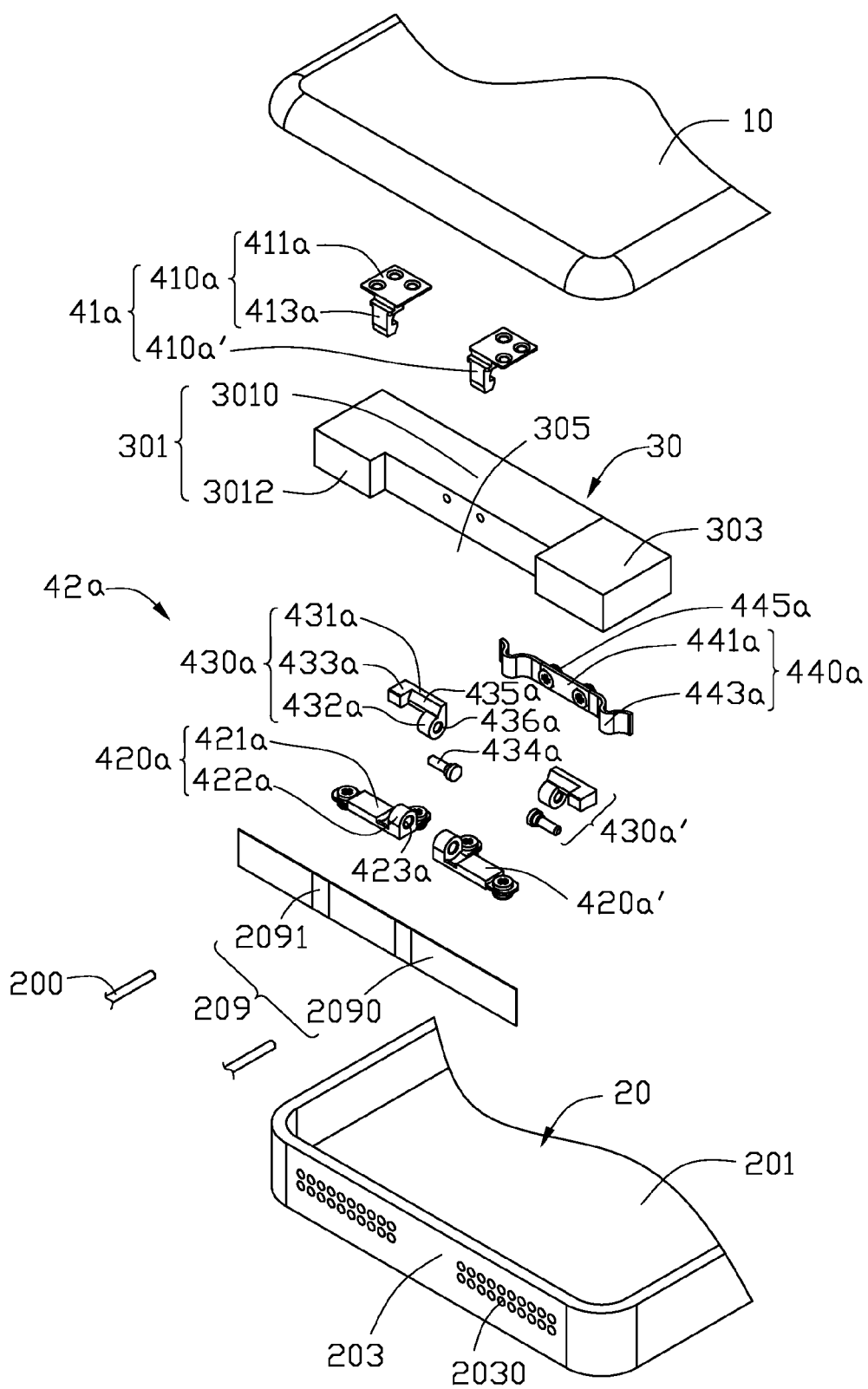
FIG. 3 is a further exploded view of the electronic device of FIG. 2.

The lower cover 20 includes a base 201, and a sidewall 203 perpendicularly extending from one rim of the base 201. Referring to FIG. 3, the sidewall 203 defines a plurality of through holes 2030. In the illustrated embodiment, the through holes 2030 are a plurality of acoustic holes of the electronic device 100. A protecting piece 209 is adhered to the inner surface of the sidewall 203 to cover the through holes 2030 to prevent penetration by dust and the like. The protecting piece 209 comprises a plate body 2090 and two breakaway portions 2091. The plate body 2090 is divided into five pieces including the breakaway portions 2091 thereof. The breakaway portions 2091 are in the middle portion of the plate body 2090 but spaced apart and correspond to two of the through holes 2030. The breakaway portions 2091 are breakaway portions joined to the neighboring portions and capable of being detached from the plate body 2090 by use of a disassembly tool 200 (partially shown in the figures) designed for the purpose and explained later. In the illustrated embodiment, the protecting piece 209 is made of dustproof mesh material.

The acoustic module 30 is on the base 201. The acoustic module 30 may be used for any or all of reproducing, recording, and transmitting sound, and includes a first acoustic module 301 and a second acoustic module 303. In the embodiment, the first acoustic module 301 is a speaker, and the second acoustic module 303 is a microphone.

The first acoustic module 301 includes a rectangular main body 3010 and a protruding portion 3012. The main body 3010 of the first acoustic module 301 is parallel to and spaced from the sidewall 203. The protruding portion 3012 and the second acoustic module 303 extend from opposite sides of the main body 3010 respectively and are symmetrical about the main body 3010. The protruding portion 3012 and the second acoustic module 303 are perpendicular to the sidewall 203, and the distance between the protruding portion 3012 and the sidewall 203 is less than the distance between the main body 3010 and the sidewall 203, thus the main body 3010 and the second acoustic module 303 cooperate with the protruding portion 3012 to define a receiving groove 305. The receiving groove 305 is between the sidewall 203 and the main body 3010.

The locking mechanism 40a includes a first locking member 41a arranged on the upper cover 10, and a second locking member 42a arranged on the lower cover 20. The first locking member 41a includes two spaced apart first locking components 410a, 410a', which have the same configuration and are mirror-images of each other. The second locking member 42a includes two base seats 420a, 420a', two second locking components 430a, 430a', which have the same configuration and are mirror-images of each other, and an elastic member 440a. It is to be noted that, in the description below, the description about the first locking component 410a', the base seat 420a', and the second locking component 430a' are omitted because they are similar to the first locking component 410a, the base seat 420a which are described below.

The first locking component 410a includes a fixing portion 411a, and a hook 413a connected to the fixing portion 411a. The fixing portion 411a is fastened on the upper cover 10 by a fixing member such as a screw (not shown). The hook 413a perpendicularly projects from the lower surface of the fixing portion 411a.

The base seat 420a includes a base body 421a and a first connecting portion 422a. The first connecting portion 422a perpendicularly protrudes from the base body 421a, and defines a first pivot hole 423a.

The second locking component 430a includes a hinge 431a, a second connecting portion 432a, a pushing portion 433a, and a pivot shaft 434a. The middle of the hinge 431a defines an inclined surface 435a. The second connecting portion 432a and the pushing portion 433a extend from opposite ends of the hinge 431a in the same direction. The second connecting portion 432a defines a second pivot hole 436a corresponding to the first pivot hole 423a. The pushing portion 433a is spaced from the second connecting portion 432a. The elastic member 440a includes a narrow strip-shaped body 441a and two arms 443a. The arms 443a extend from opposite ends of the body 441a and are curved in the same direction and manner to form a shallow U-shaped.

In the illustrated embodiment, the means of connection among the first locking component 410a, the base seat 420a and the second locking component 430a is the same as that for the first locking component 410a', the base seat 420a' and the second locking component 430a', and is as follows.

Referring to FIG. 2, in assembly, the protecting piece 209 is adhered on the inner surface of the sidewall 203, with the breakaway portions 2091 corresponding to two of the through holes 2030. The acoustic module 30 is positioned on the base 201. The protruding portion 3012 and the second acoustic module 303 face the protecting piece 209. The base seat 420a is mounted on the base 201 and is received between the protecting piece 209 and the acoustic module 30. The second locking component 430a is connected to the base seat 420a, with the guide surface 435a facing the sidewall 203 and the pushing portion 433a corresponding to one of the breakaway portion 2091. In this state, the first pivot hole 423a is aligned with the second pivot hole 436a, and the pivot shaft 434a is inserted into the first pivot hole 423a and the second pivot hole 436a respectively.

The elastic member 440a is received in the receiving groove 305 and is positioned between the acoustic module 30 and the base seats 420a, 420a'. The body 441a is fixed to the main body 3010 of the acoustic module 30 by two fixing members 445a, the projection part of the arms 443a resist the second locking components 430a, 430a'. The first locking component 410a is fixed on the upper cover 10 and corresponds to the second locking component 430a. In this state, the second locking component 430a is rotatably coupled to the base seat 420a and is movable between a locking position for engaging with the first locking component 410a and an unlocking position where it is disengaged from the first locking component 410a.

Referring to FIG. 4, when the upper cover 10 is secured to the lower cover 20, the hook 413a of the first locking component 410a is guided by the corresponding inclined surface 435a to hook to the hinge 431 a and is received between the second connecting portion 432a and the pushing portion 433a to lock the upper cover 10 to the lower cover 20.

It is to be noted that, in the description below, the means of disengaging the first locking component 410a' from the second locking component 430a' is same as disengaging the first locking component 410a from the second locking component 430a, and is as follows.

To unlock the upper cover 10 from the lower cover 20 for the first time after initial assembly, a user inserts pegs of the disassembly tool 200 into two of the through holes 2030 which pushes the corresponding breakaway portion 2091 away from the plate body 2090 and pushes the pushing portion 433a, causing the second locking component 430a to rotate and detach from the first locking component 410a, and the elastic member 440a is compressed. In this state, the second locking component 430a is disengaged from the first locking component 410a, and the upper cover 10 can be separated from the lower cover 20. When the disassembly tool 200 is not applied to the pushing portion 433a, the second locking component 430a is returned to the locking position by rebounding of the elastic member 440a.

The locking mechanism 40a is positioned in the interior electronic device 100, so it is difficult for the user to find and disassemble. Even if the user does find and use the locking mechanism 40a, the breakaway portions 2091 will be broken from the plate body 2090 and provide evidence of disassembly.

Figure 5:
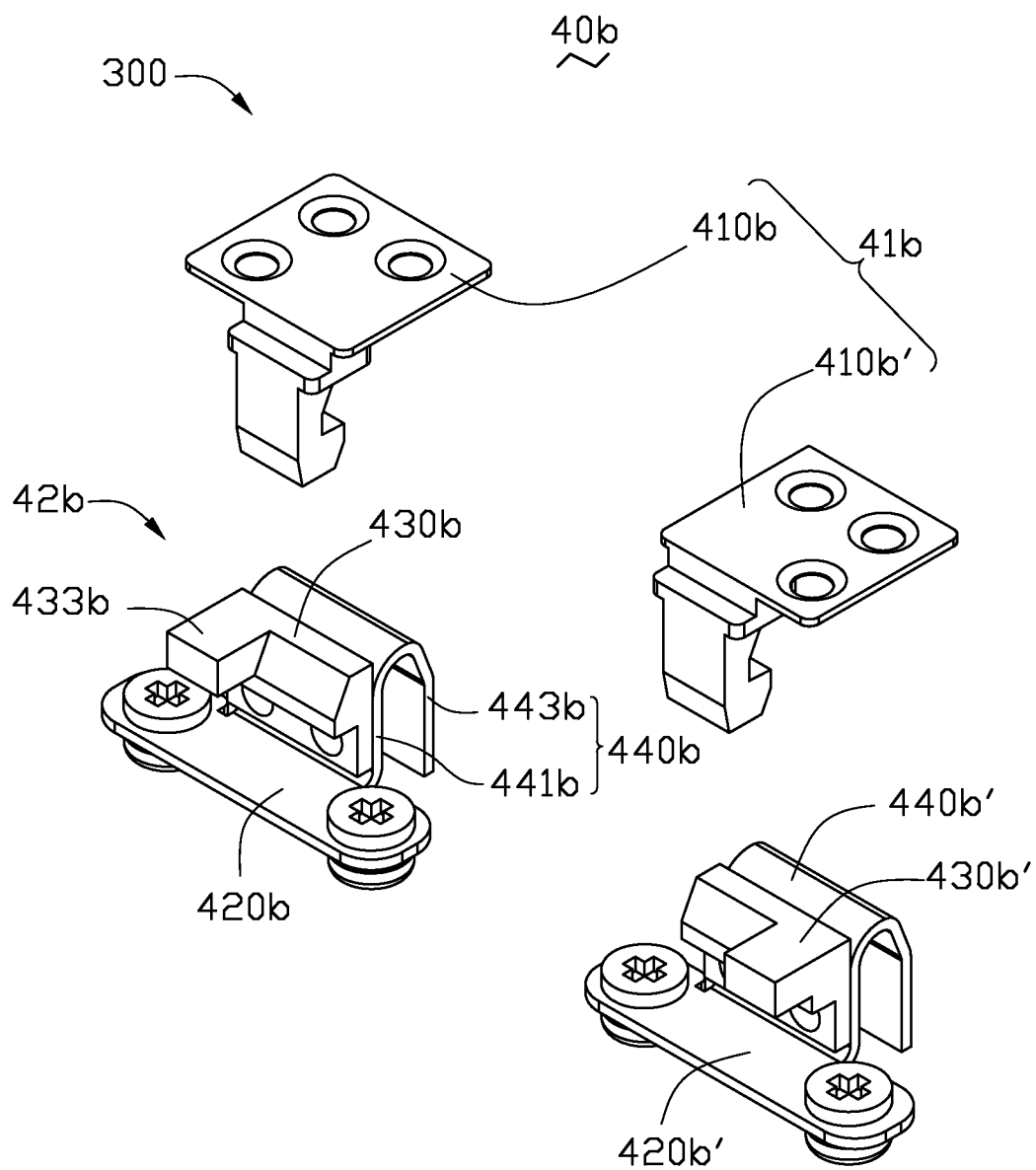
FIG. 5 is an exploded view of the locking mechanism in a second embodiment.

Referring to FIG. 5, an electronic device 300 with a locking mechanism 40b according to a second embodiment is provided. The electronic device 300 according to the second embodiment has the substantially same arrangement as that of the electronic device 100 according to the first embodiment described above, except the locking mechanism 40b.

The locking mechanism 40b includes a first locking member 41b and a second locking member 42b. The first locking member 41b includes two first components 410b, 410b' which are the same as the first locking components 410a, 410a' respectively in the first embodiment, and description about the first components 410b, 410b' is omitted.

The second locking member 42b includes two base seats 420b, 420b', two second locking components 430b, 430b', and two elastic members 440b, 440b', which have the same configuration except for being mirror-images of each other. It is to be noted that, in the description below, the description about the base seat 420b', the second locking component 430b' and the elastic member 440b' is omitted because they are similar to the base seat 420b, the second locking component 430b and the elastic member 440b which are described below.

The base seat 420b does not include the first connecting portion 422a as does the base seat 420a shown in the first embodiment. Additionally, the second locking component 430b does not include the second connecting portion 432a corresponding to the first connecting portion 422a as does the second locking component 430a shown in FIG. 4. The elastic member 440b is substantially U-shaped in plan view, and includes an elastic body 441b and an elastic arm 443b. The elastic body 441b perpendicularly extends from one rim of the base seat 420b. The elastic arm 443b is bent from an end of the elastic body 441b away from the base seat 420b.

In the illustrated embodiment, the means of connection among the first locking component 410b, the base seat 420b and the second locking component 430b is the same as that for the first locking component 410b', the base seat 420b' and the second locking component 430b', and is as follows.

In assembly, the second locking component 430b is secured to a surface of the elastic body 441b back to the elastic arm 443b using any suitable approach, including for example welding, gluing or using a fastener. The elastic arm 443b abuts against the main body 3010 of the acoustic module 30.

It is to be noted that, in the description below, the means of disengaging the first locking component 410b from the second locking component 430b is the same as the first locking component 410b' and the second locking component 430b', and is as follows.

To unlock the upper cover 10 from the lower cover 20 for the first time after initial assembly, a user inserts pegs of the disassembly tool 200 into the through holes 2030 which pushes the corresponding breakaway portion 2091 away from the plate body 2090 and pushes the pushing portion 433b, causing the second locking component 430b to move and detach from the first locking component 410b, and the elastic member 440b is compressed away from the base seat 420b. In this state, the second locking component 430b is disengaged from the first locking component 410b and the upper cover 10 can be separated from the lower cover 20. When the disassembly tool 200 is not applied to the pushing portion 433b, the second locking component 430b is returned to the locking position by rebounding of the elastic member 440b.

Figure 6:
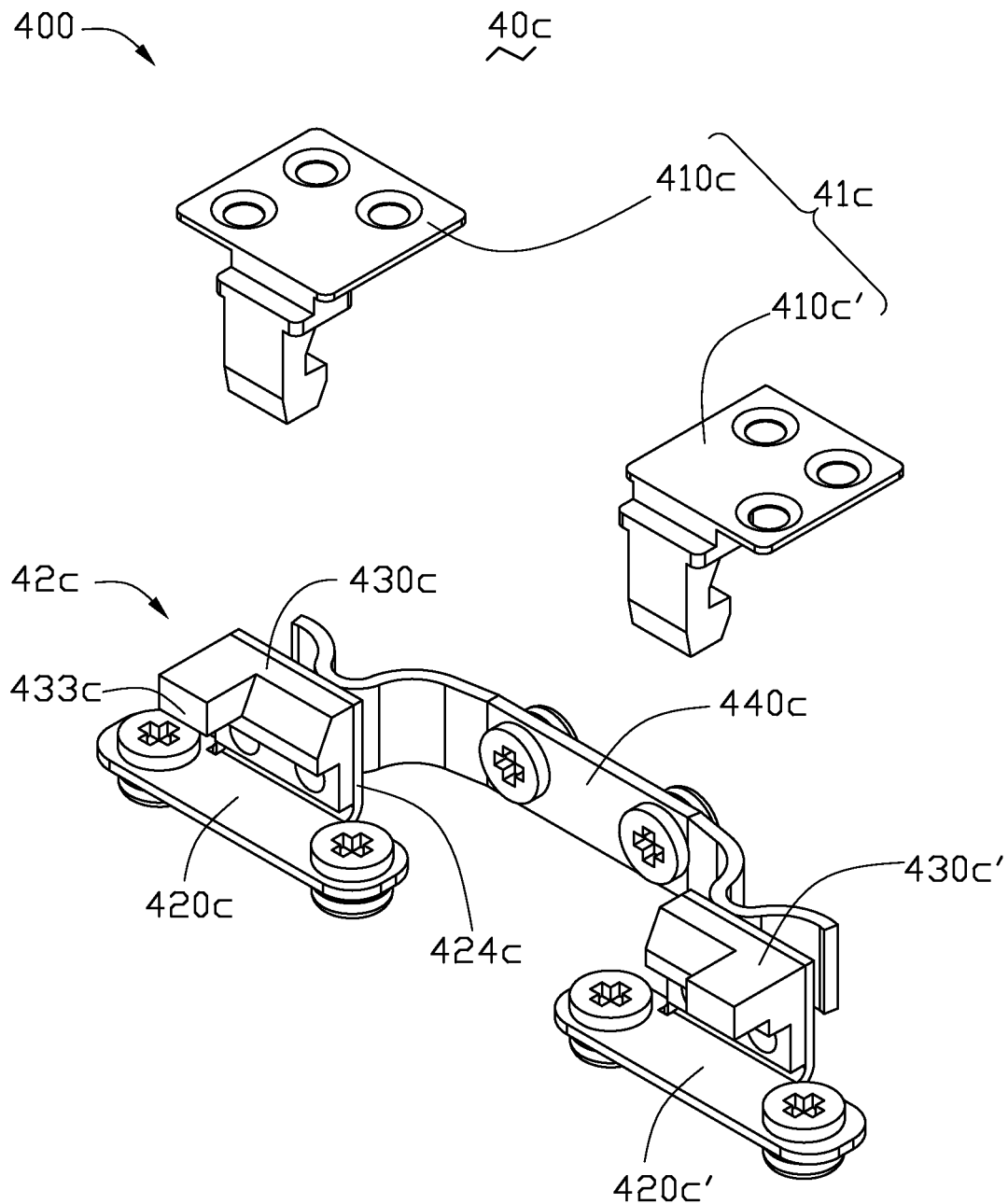
FIG. 6 is an exploded view of the locking mechanism in a third embodiment.

Referring to FIG. 6, an electronic device 400 according to a third embodiment is provided. The electronic device 400 according to the third embodiment has substantially the same arrangement as that of the electronic devices 100, 300 according to the first and second embodiments described above, except for the locking mechanism 40c.

The locking mechanism 40c includes a first locking member 41c and a second locking member 42c. The first locking member 41c includes two first components 410c, 410c' which are the same as the first locking components 410a, 410a' respectively in the first embodiment, and description about the first components 410c, 410c' is omitted.

The second locking member 42c includes two base seats 420c, 420c', two second locking components 430c, 430c', which have the same configuration except for being mirror-images of each other, and an elastic member 440c. It is to be noted that, in the description below, description about the base seat 420c', the second locking component 430c' and the elastic member 440c' is omitted because they are similar to base seat 420c, the second locking component 430c and the elastic member 440c which are described below.

The base seat 420c has an added elastic block 424c compared with the base seat 420b shown in FIG. 5. The elastic block 424c is substantially plate-shaped and extends from one rim of the base seat 420c. The second locking component 430c and the elastic member 440c are respectively the same as the second locking component 430b and the elastic member 440b shown in FIG. 5.

In the illustrated embodiment, the means of connection among the first locking component 410c, the base seat 420c, and the second locking component 430c is the same as that for the first locking component 410c', the base seat 420c' and the second locking component 430c', and is as follows.

In assembly, the second locking component 430c is secured to a surface of the elastic block 424c back to the elastic member 440c, by way of welding, gluing or using a fastener. The elastic member 440c resists a surface of the elastic block 424c back to the second locking component 430c.

It is to be noted that, in the description below, the means of disengaging the first locking component 410c from the second locking component 430c is the same as the first locking component 410c' and the second locking component 430c', and is as follows.

To unlock the upper cover 10 from the lower cover 20 for the first time after initial assembly, a user inserts pegs of the disassembly tool 200 into two of the through holes 2030 which pushes the corresponding breakaway portion 2091 away from the plate body 2090 and pushes the pushing portion 433c, causing the second locking component 430c to move and detach from the first locking component 410c, and the elastic member 440c and the elastic block 424c are compressed. In this state, the second locking component 430c is disengaged from the first locking component 410c, and the upper cover 10 can be separated from the lower cover 20. When the disassembly tool 200 is not applied to the pushing portion 433c, the second locking component 430c is returned to the locking position by rebounding of the elastic member 440c and the elastic block 424c.

Figure 7:
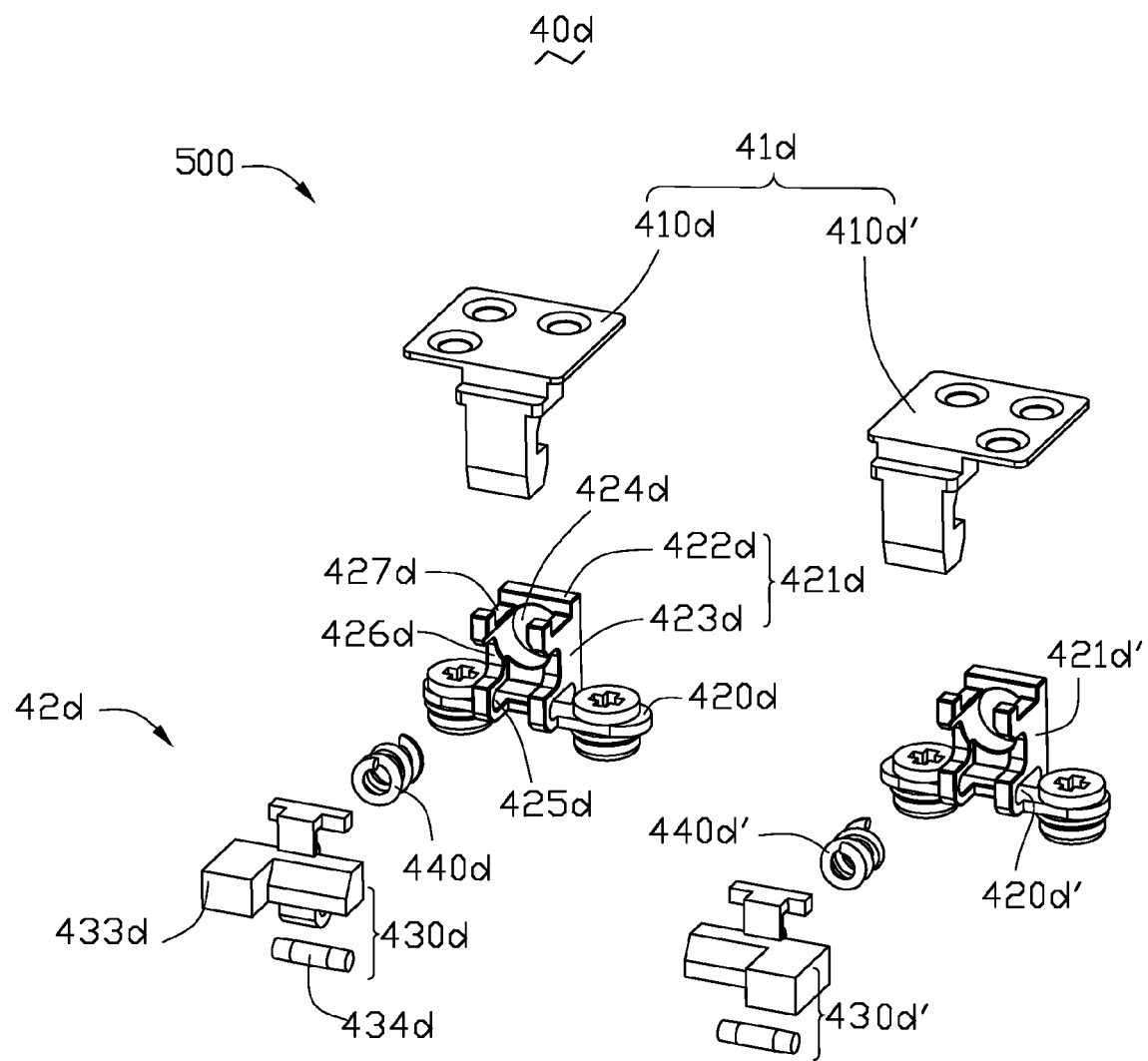
FIG. 7 is an exploded view of the locking mechanism in a fourth embodiment.
Figure 8:
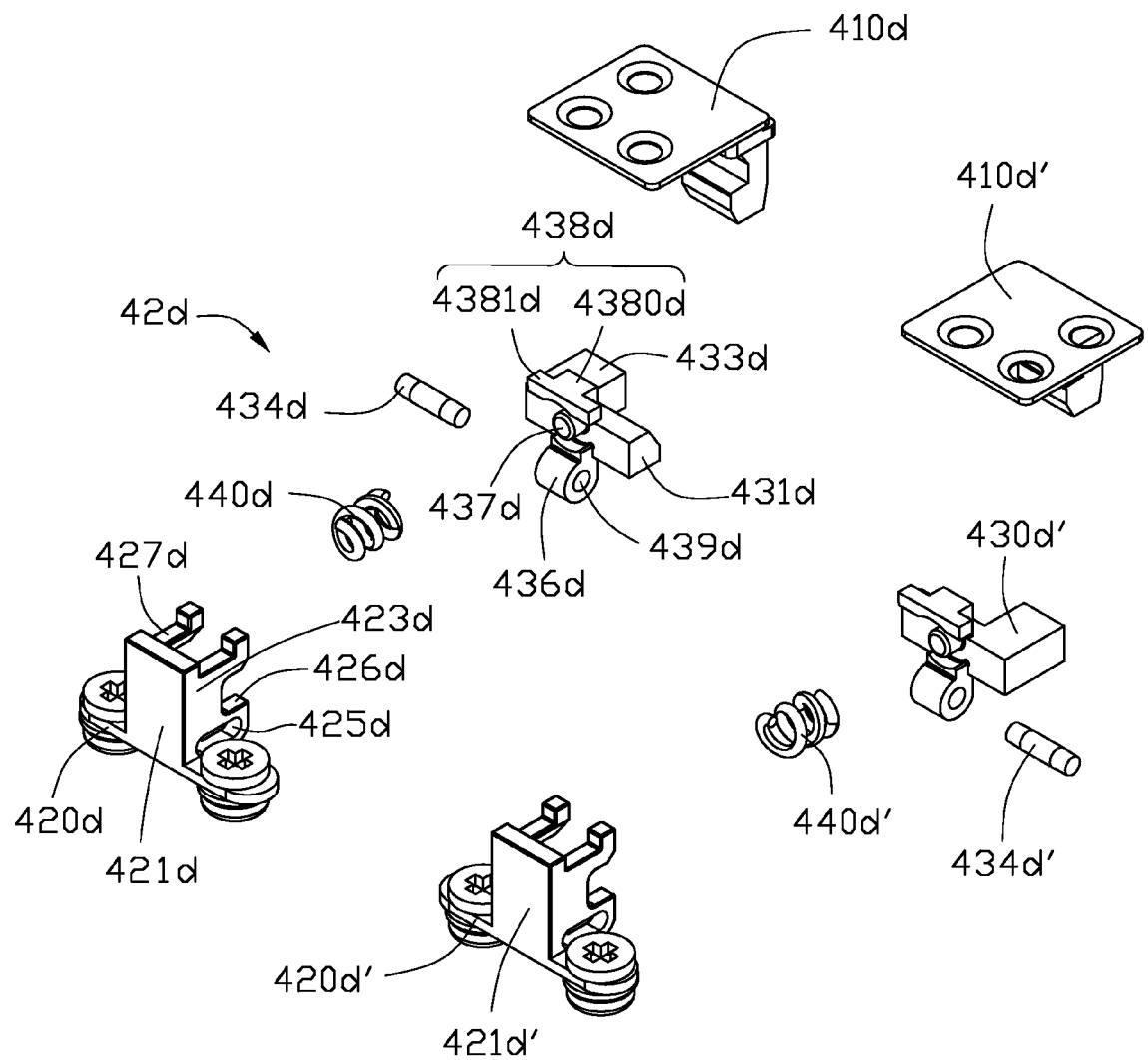
FIG. 8 is similar to FIG. 7, but viewed from another aspect.

Referring to FIGS. 7 and 8, an electronic device 500 according to a fourth embodiment is provided. The electronic device 500 according to the fourth embodiment has substantially the same arrangement as that of the electronic devices 100, 300, 400 according to the first to third embodiments described above, except for the locking mechanism 40d.

The locking mechanism 40d includes a first locking member 41d, and a second locking member 42d. The first locking member 41d includes two first components 410d, 410d' which are the same as the first locking components 410a, 410a' respectively in the first embodiment, and description about the first components 410d, 410d' is omitted.

The second locking member 42d includes two base seats 420d, 420d', two second locking components 430d, 430d', and two springs 440d, 440d', which have the same configuration except for being mirror-images of each other. It is to be noted that, in the description below, the description about the base seat 420d', the second locking component 430d', and the spring 440d' is omitted because they are similar to base seat 420d, the second locking component 430d and the spring 440d which are described below.

The base seat 420d has added an engaging portion 421d compared with the base seat 420c shown in FIG. 6. The engaging portion 421d includes a first engaging portion 422d and two second engaging portions 423d. The first engaging portion 422d is substantially plate-shaped, and perpendicularly protrudes from the middle portion of the base seat 420d. The first engaging portion 422d defines a concave portion 424d facing the second locking component 430d. The second engaging portion 423d perpendicularly extends from opposite rims of the corresponding first engaging portion 422d respectively. Each second engaging portion 423d defines a slide hole 425d, a groove 426d, and a slide slot 427d. Each slide hole 425d is positioned at one end of each second engaging portion 423d adjacent to the base seat 420d. Each slide slot 427d is positioned at the other end of each second engaging portion 423d opposite to the corresponding slide hole 425d. Each groove 426d is positioned in the middle of each second engaging portion 423d, with an opening configured to receive 431d.

The second locking component 430d has added a pivot shaft 434d, a third connecting portion 436d, a fixing portion 437d, and a slide portion 438d which protrude from a surface of the hinge 431d back to the pushing portion 433d in the same direction. The third connecting portion 436d defines an engaging hole 439d.

The fixing portion 437d is substantially cylindrical, and is positioned between the slide portion 438d and third connecting portion 436d. The slide portion 438d is substantially T-shaped, and is opposite to the third connecting portion 436d. The slide portion 438d includes a shaft portion 4380d and two slide shafts 4381d. The shaft portion 4380d is perpendicular to the hinge 431d and receives in the corresponding slide slot 427d. Two slide shafts 4381d are perpendicularly extended from opposite ends of the shaft portion 4380d respectively.

In the illustrated embodiment, the means of connection among the first locking component 410d, the base seat 420d, the engaging portion 421d, and the second locking component 430d is the same as that for the first locking component 410d', the base seat 420d', the engaging portion 421d', and the second locking component 430d', and is as follows.

Figure 9:
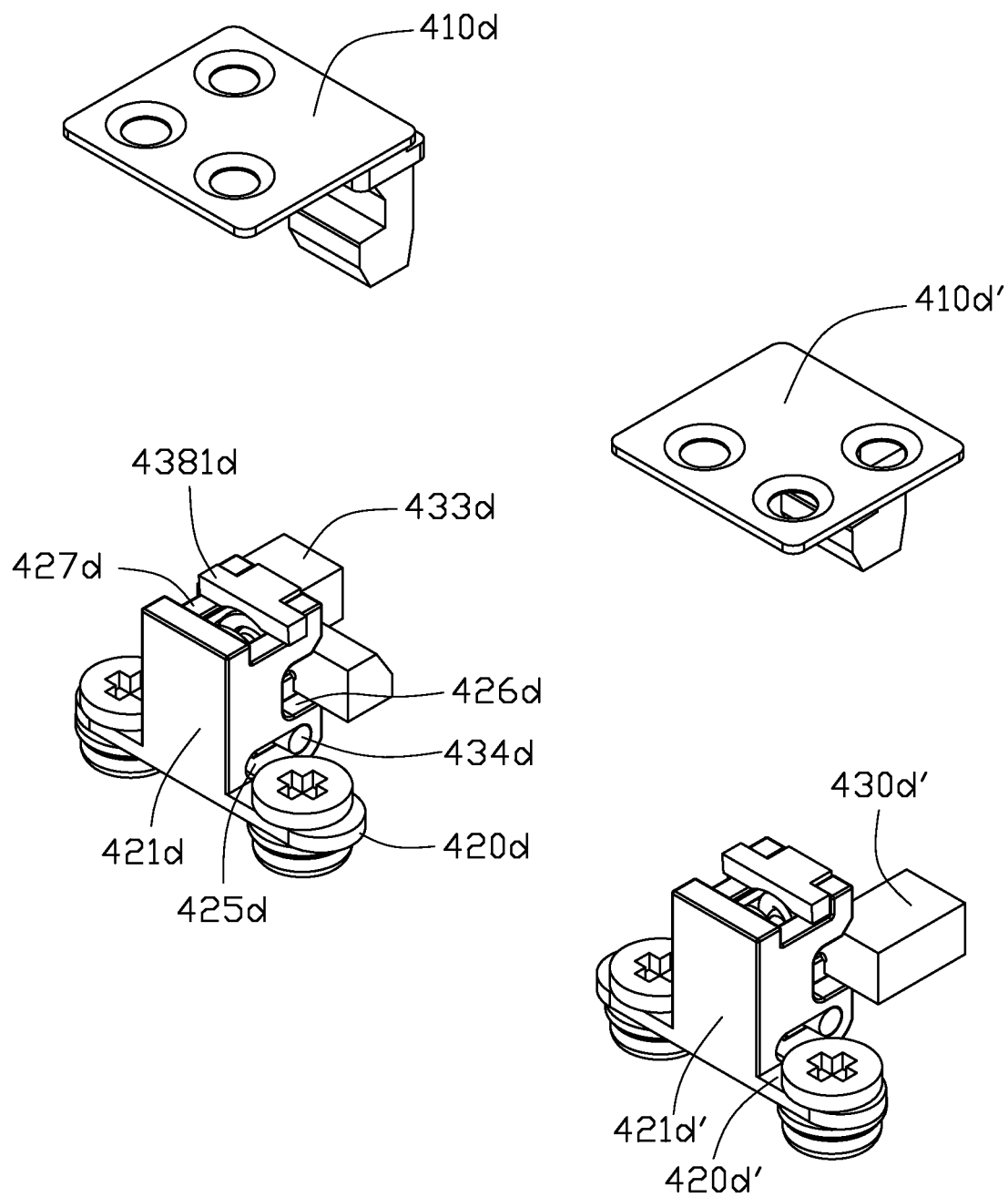
FIG. 9 is a partial assembled view of the electronic device of FIG. 8.

Referring also to FIG. 9, in assembly, the third connecting portion 436d is received between the second engaging portions 423d, with the engaging hole 439d aligned with the slide holes 425d. The pivot shaft 434d is inserted into the slide holes 425d and the engaging hole 439d respectively. One end of the spring 440d is sleeved on the fixing portion 437d and the other opposite end the spring 440d is received in the concave portion 424d. The slide shafts 4381d are received in the slide slots 427d respectively.

When the upper cover 10 is secured to the lower cover 20, the first locking component 410d hooks to the second locking component 430d, and the second locking component 430d is retained in an end of the slide holes 425d away from the first engaging portion 422d (the locking position) by the force of the spring 440d.

It is to be noted that, in the description below, the means of disengaging the first locking component 410d from the second locking component 430d is same as the first locking component 410d' and the second locking component 430d', and is as follows.

To unlock the upper cover 10 from the lower cover 20 for the first time after initial assembly, a user inserts pegs of one disassembly tool 200 through one of the through hole 2030 which pushes the breakaway portion 2091 away from the plate body 2090 and pushes the pushing portion 433d, causing the second locking component 430d to slide and detach from the first locking component 410d, and the spring 440d is compressed. In this state, the second locking component 430d is disengaged from the first locking component 410d, and the upper cover 10 can be separated from the lower cover 20. When the disassembly tool 200 is not applied to the pushing portion 433d, the second locking component 430d is capable of driving back to the locking position by the spring 440d.

Although information and the advantages of the present embodiments have been set forth in the foregoing description, together with details of the structures and functions of the present embodiments, the disclosure is illustrative only; changes may be made in detail, especially in the matters of shape, size, and arrangement of parts within the principles of the present embodiments to the full extent indicated by the broad general meaning of the terms in which the appended claims are expressed.

What is claimed is:

1. An electronic device, comprising:
   an upper cover;
   a lower cover coupled to the upper cover; and
   at least one locking mechanism for locking the upper cover to the lower cover, and a disassembly tool capable of being operated to unlock the upper cover from the lower cover, wherein the at least one locking mechanism comprises:
   a first locking member positioned on the upper cover; and
   a second locking member positioned on the lower cover, the second locking member is capable of being moved between a locking position for engaging with the first locking member and an unlocking position for disengaging with the first locking member;
   wherein the lower cover defines at least one through hole, the at least one through hole are acoustic holes of the electronic device and empty for transmitting vocal sound and allowing insertion of the disassembly tool, when the disassembly tool extends through the at least one through hole and pushes the second locking member, the second locking member is disengaged from the first locking member for allowing the upper cover be unlocked from the lower cover.

2. The electronic device as claimed in claim 1, wherein a protecting piece positions on an inner surface of the lower cover to cover the at least one through hole, the protecting piece comprises at least one breakaway portion corresponding to the at least one through hole, when the disassembly tool extends through the at least one through hole and abuts against the corresponding protecting portion, the breakaway portion is detachable from the protecting piece to allow the disassembly tool inserting into the electronic device.

3. The electronic device as claimed in claim 1, wherein the first locking member comprises a fixing portion and a hook, the fixing portion is fixed on the upper cover, the hook projects from the lower surface of the fixing portion.

4. The electronic device as claimed in claim 3, wherein the second locking member comprises a base seat mounted on the lower cover and a second locking component, the second locking component rotatably couples to the base seat and is capable of being rotated between the locking position and the unlocking position.

5. The electronic device as claimed in claim 4, wherein the second locking component comprises an inclined surface for guiding the hook to hook up with the second locking component.

6. The electronic device as claimed in claim 4, wherein the base seat comprises an elastic block extended from one rim of the base seat, the second locking component is positioned on the elastic block and is capable of being returned to the locking position by rebounding of the elastic block.

7. The electronic device as claimed in claim 6, wherein the second locking member comprises an elastic member, the elastic member resists the elastic block for driving the second locking component back to the locking position.

8. The electronic device as claimed in claim 4, wherein the second locking member comprises an elastic member, the elastic member comprises an elastic body and an elastic arm, the elastic body extends from one rim of the base seat, the elastic arm is bent from an end of the elastic body away from the base seat, the second locking component is positioned on the elastic body and is capable of being returned to the locking position by rebounding of the elastic member.

9. The electronic device as claimed in claim 4, wherein the second locking member comprises an elastic member, the elastic member includes a body and two arms, the two arms extend from opposite ends of the body and abut against the second locking component for driving the second locking component back to the locking position.

10. The electronic device as claimed in claim 1, wherein the second locking member comprises a base seat mounted on the lower cover and a second locking component, the second locking component slidably couples to the base seat and is capable of sliding between the locking position and the unlocking position.

11. The electronic device as claimed in claim 10, wherein the base seat comprises an engaging portion, the engaging portion defines a slide hole, the second locking component comprises a third connecting portion, the third connecting portion defines an engaging hole corresponding to the slide hole, a pivot shaft extends through the slide hole and the engaging hole for allowing the second locking component to be slidably coupled to the engaging portion.

12. The electronic device as claimed in claim 11, wherein the second engaging portion further comprises a slide slot opposite to the slide hole, the second locking component comprises a slide portion slidably received in the slide slot for allowing the second locking component to be slidably coupled to the engaging portion.

13. The electronic device as claimed in claim 10, wherein the second locking member comprises an elastic member, the elastic member is arranged between the second locking component and the engaging portion for driving the second locking component back to the locking position.

14. A locking mechanism, for locking a first object to a second object, and for allowing to be operated to unlock the first object to the second object by a disassembly tool, the locking mechanism comprising:
   a first locking member positioned on the first object; and
   a second locking member positioned on the second object, the second locking member capable of being moved between a locking position for engaging with the first locking member and an unlocking position for disengaging with the first locking member;

wherein the second object defines at least one through hole, the at least one through hole are acoustic holes of the electronic device and empty for transmitting vocal sound and allowing insertion of the disassembly tool, when the disassembly tool extends through the at least one through hole and pushes the second locking member, the second locking member is disengaged from the first locking member for allowing the first object to be unlocked from the second object.

15. The locking mechanism as claimed in claim 14, wherein the second locking member comprises a base seat mounted on the second object and a second locking component, the second locking component rotatably coupled to the base seat and capable of being rotated between the locking position and the unlocking position.

16. The locking mechanism as claimed in claim 15, wherein the second locking member comprises an elastic member, the elastic member comprises an elastic body and an elastic arm, the elastic body extends from one rim of the base seat, the elastic arm is bent from an end of the elastic body away from the base seat, the second locking component is positioned on the elastic body and capable of being returned to the locking position by rebounding of the elastic member.

17. The locking mechanism as claimed in claim 14, wherein the second locking member comprises an elastic member, the elastic member includes a body and two arms, the arms extend from opposite ends of the body and abut against the second locking component for driving the second locking component back to the locking position.

18. The locking mechanism as claimed in claim 14, wherein the second locking member comprises a base seat mounted on the second object and a second locking component, the second locking component slidably coupled to the base seat and capable of sliding between the locking position and the unlocking position.

19. The locking mechanism as claimed in claim 18, wherein the base seat comprises an engaging portion, the engaging portion defines a slide hole, the second locking component comprises a third connecting portion, the third connecting portion defines an engaging hole corresponding to the slide hole, a pivot shaft extends through the slide hole and the engaging hole for allowing the second locking component to be slidably coupled to the engaging portion.

20. The locking mechanism as claimed in claim 14, wherein the second locking member comprises an elastic member, the elastic member is arranged between the second locking component and the engaging portion for driving the second locking component back to the locking position.

* * * * *